United States Patent
Tummala et al.

(10) Patent No.: US 9,417,415 B2
(45) Date of Patent: Aug. 16, 2016

(54) INTERPOSER WITH POLYMER-FILLED OR POLYMER-LINED OPTICAL THROUGH-VIAS IN THIN GLASS SUBSTRATE

(71) Applicant: Georgia Tech Research Corporation, Atlanta, GA (US)

(72) Inventors: Rao R. Tummala, Atlanta, GA (US); Chia-Te Chou, Atlanta, GA (US); Venkatesh Sundaram, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 14/288,680

(22) Filed: May 28, 2014

(65) Prior Publication Data

US 2014/0355931 A1    Dec. 4, 2014

Related U.S. Application Data

(60) Provisional application No. 61/827,887, filed on May 28, 2013.

(51) Int. Cl.
  *G02B 6/43* (2006.01)
  *G02B 6/136* (2006.01)
  *H05K 1/02* (2006.01)

(52) U.S. Cl.
  CPC ............. *G02B 6/43* (2013.01); *H05K 1/0274* (2013.01); *H05K 2201/09827* (2013.01)

(58) Field of Classification Search
  CPC .............. H05K 1/0274; H05K 2201/09827; G02B 6/43
  USPC ............. 385/14–16; 264/18, 24, 1.27, 1.37; 205/221
  See application file for complete search history.

(56) References Cited

U.S. PATENT DOCUMENTS

2002/0051599 A1\* 5/2002 Tsukamoto et al. ............ 385/14
2008/0170819 A1\* 7/2008 Kodama et al. ................ 385/14

FOREIGN PATENT DOCUMENTS

| JP | 2007293308 A | 11/2007 |
| JP | 2010085438 A | 4/2010 |
| WO | 2008081727 A1 | 7/2008 |

OTHER PUBLICATIONS

H. Schroder et al., "Advanced Thin Glass Based Photonic PCB Integration," in Electronic Components and Technology Conference, 2012.

(Continued)

*Primary Examiner* — Akm Enayet Ullah
(74) *Attorney, Agent, or Firm* — Troutman Sanders LLP; Ryan A. Schneider; Alexis N. Simpson

(57) ABSTRACT

An optical interposer that includes a glass substrate having one or more optical vias extending through the glass substrate. A first optical polymer may be bonded to the substrate and to interior surfaces of the one or more optical vias. Implementations include one or more optical via cores comprising a second optical polymer that has a greater refractive index than the first optical polymer. The one or more optical via cores may be at least partially surrounded by the first optical polymer. Embodiments include encapsulated optical waveguides in communication with the optical vias and/or via cores. Example implementations include layers of electrical insulation, electrical traces, and electrical vias. A method of manufacture includes forming the optical vias by laser ablation. Certain embodiments may include chemically etching the inside of the vias to improve surface roughness.

9 Claims, 8 Drawing Sheets

(56) References Cited

OTHER PUBLICATIONS

M, Parekh, P. Thadesar, M. Bakir, "Electrical, Optical and Fluidic Through-Silicon Vias for Silicon Interposer Applications," in Electronic Components and Technology Conference, 2011.

Cunningham, J. E., et al, "Integration and Packaging of a Macrochip With Silicon Nanophotonic Links", IEEE Journal of Selected Topics in Quantum Electronics, vol. PP, No. 99, pp. 1-13, 2011.

Y. Takagi, et al., "Low-loss chip-to-chip optical interconnection using multichip optoelectronic package with 40-Gb/s optical I/O for computer applications," IEEE/OSA J. Lightwave Technol.,vol. 28, No. 20, pp. 2956-2963, Oct. 2010.

W. Lee, S. Hwang, J. Lim, B. Rho, "Polymeric Waveguide Film with Embedded Mirror for Multilayer Optical Circuits," IEEE Photonics Technology Letters, vol. 21 No. 1, Jan. 2009.

C. Manolatou and H. Haus, "Passive components for dense optical integration," Kluwer, 2001.

International Search Report for Related PCT Application No. PCT/US2014/039828, mailed Sep. 10, 2014.

Yutaka, Takagi et al.: "Optical through-hole with high aspect ration for on-board optical transmission," 2011 Optical Fiber Communication Conference and Exposition and the National Fiber Optic Engineers Conference; Mar. 6-10, 2011; pp. 1-3.

Vijay, Sukumaran et al.: "Through-package-via formation and metallization of glass interposers," Electronic Components and Technology Conference, Jun. 1, 2010; pp. 557-563.

Xiaoyun, Cui et al.: "Glass as a Substrate for High Density Electrical Interconnect," Electronic Components and Technology Conference, Dec. 9, 2008; pp. 12-17.

\* cited by examiner

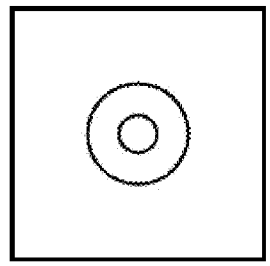
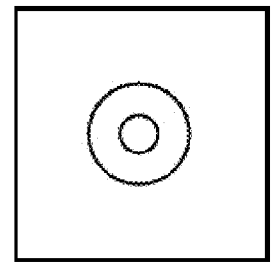
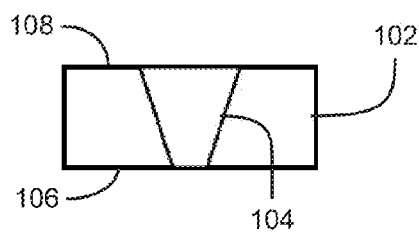
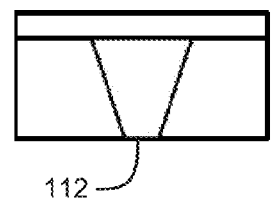
FIG. 2A
FIG. 2C
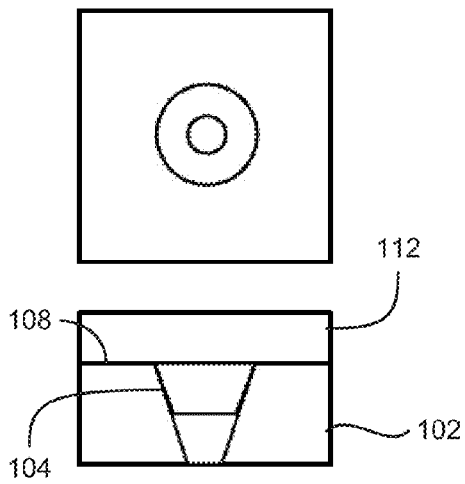
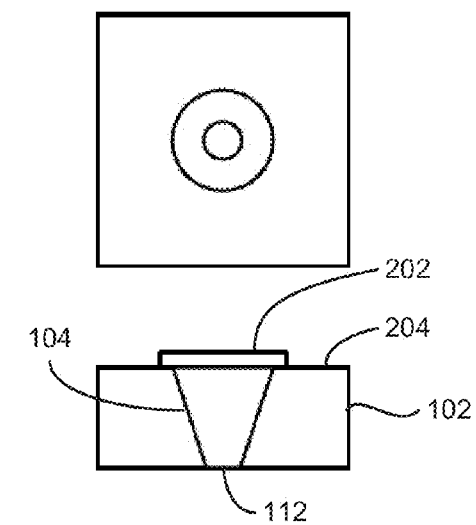
FIG. 2B
FIG. 2D

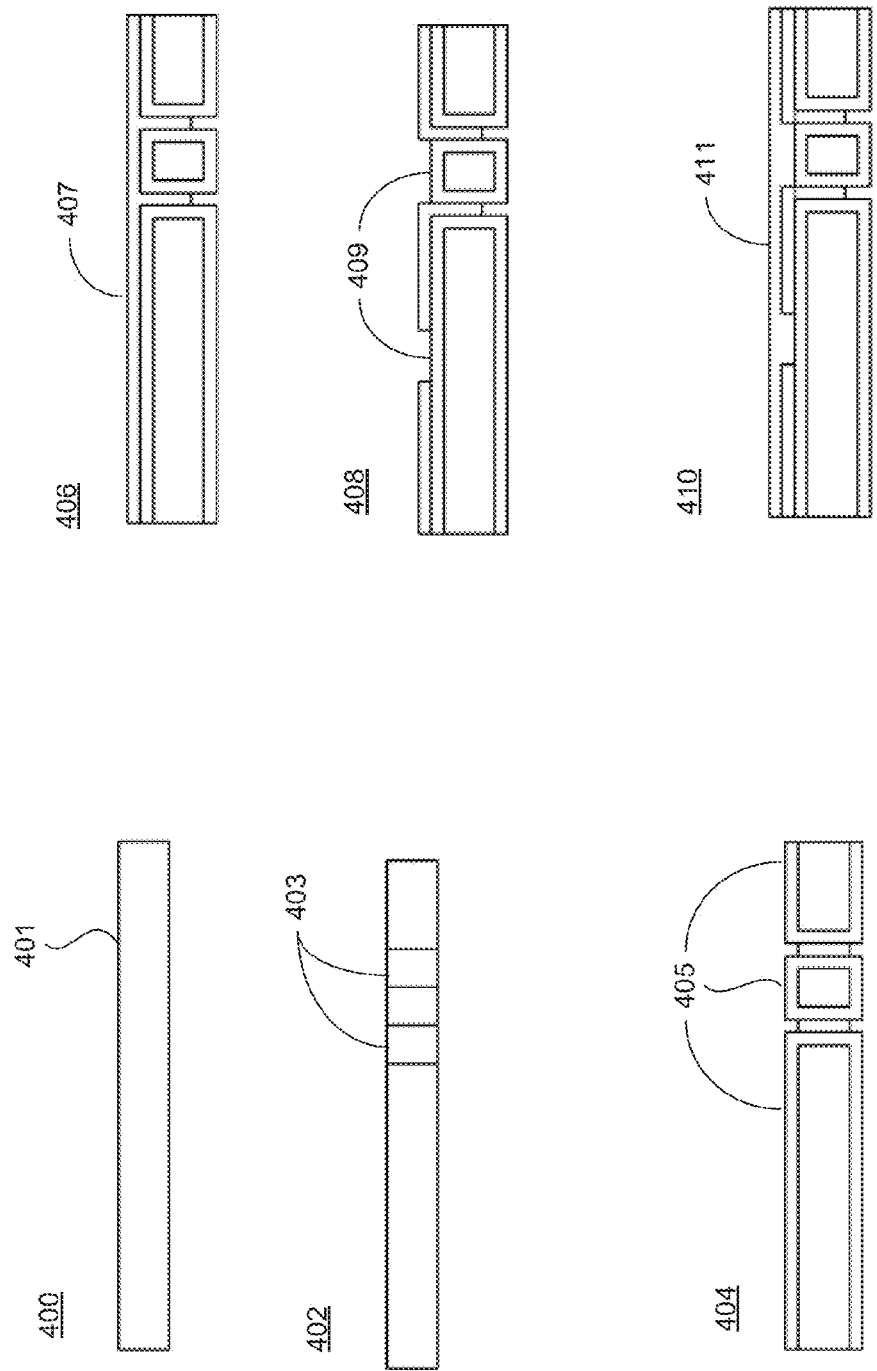

INTERPOSER WITH POLYMER-FILLED OR POLYMER-LINED OPTICAL THROUGH-VIAS IN THIN GLASS SUBSTRATE

CROSS-REFERENCE TO RELATED APPLICATIONS AND PRIORITY CLAIM

This application claims priority to U.S. Provisional Patent Application No. 61/827,887, filed May 28, 2013 and entitled "Low Loss Glass-Polymer Optical Via Formation on Glass," the contents of which are fully incorporated herein by reference.

FIELD OF THE INVENTION

The invention relates generally to optical communication and more specifically to optical communication between integrated circuits (ICs) or electronic components.

BACKGROUND

As the need for increasing data rates continues, and as computing devices become faster and smaller to meet such needs, a reduction in the size of corresponding chip packaging creates corresponding challenges for input-output (I/O) terminal density, crosstalk, heat dissipation, etc. Certain state-of-the-art components require speeds and I/O density that may no longer be achievable through traditional printed circuit board (PCB) manufacturing technologies. Device designers are now turning to "interposers" to allow for a higher density of input/output connections.

Interposers take advantage of integrated circuit (IC) manufacturing techniques to achieve small I/O pin spacing for electronics components. Interposers use tightly-spaced solder pads for connecting to the IC at a high connection density. The solder pads of the interposers are internally-connected to more widely spaced solder pads (for example, on the opposite side of the interposer) for soldering to a PCB. Multiple components can also be mounted to the same interposer, either on the same side or opposite sides, to reduce the data lag associated with routing high-speed data transmissions through the PCB. However, components have evolved to speeds and package sizes where even traditional interposers are insufficient to achieve acceptable data exchange.

SUMMARY

Embodiments of the disclosed technology include a glass-polymer interposer. In one example implementation, an optical interposer is provided that includes a glass substrate having a first surface and a second surface. The second surface of the glass substrate is substantially parallel with the first surface. The glass substrate includes one or more optical vias extending through the glass substrate and substantially perpendicular to the first surface. In an example implementation, the one or more optical vias include a first optical polymer in contact with an interior surface of the one or more optical vias. In one example implementation, the vias may be formed using laser ablation. In certain example implementations, the vias may be tapered.

Certain example implementations of the disclosed technology include a method of manufacturing an interposer. The method includes forming one or more optical vias though a glass substrate. The optical vias extend through the glass substrate and are substantially perpendicular to a first surface of the glass substrate. The method includes filling the one or more tapered optical vias with an optical polymer. In one example implementation, the vias may be formed using laser ablation. In certain example implementations, the vias may be tapered.

Another method of manufacturing an interposer is disclosed, according to an example implementation of the disclosed technology. The method includes forming one or more optical vias though a glass substrate, wherein the optical vias extend through the glass substrate and are substantially perpendicular to a first surface of the glass substrate. In one example implementation, the vias may be formed using laser ablation. In certain example implementations, the vias may be tapered. The method includes depositing a base optical isolation layer on at least a portion of one or more of the first surface and a second surface of the glass substrate and on interior surfaces of the one or more optical vias, the base optical isolation layer includes a first optical polymer. The method further includes depositing one or more optical waveguides on at least a portion of the base optical isolation layer. The one or more optical waveguides include second optical polymer. The method further includes depositing one or more optical via cores within the optical vias, wherein the one or more optical via cores comprise the second optical polymer having a higher refractive index than the first optical polymer, the one or more optical via cores extending through the one or more optical vias from the first surface to the second surface of the glass substrate and are in contact with and at least partially surrounded by the base optical isolation layer first optical polymer. The method further includes depositing an upper optical isolation layer on the optical waveguides and the base optical isolation layer, wherein the optical waveguides are at least partially encapsulated by the base layer and the upper optical isolation layer.

A system is provided, according to an example implementation of the disclosed technology. The system includes one or more integrated circuits connected to an interposer. The interposer includes a glass substrate having a first surface and a second surface, the second surface substantially parallel with the first surface. The interposer includes one or more optical vias extending through the glass substrate and substantially perpendicular to the first surface, the one or more optical vias include a first optical polymer bonded to an interior surface of the one or more tapered optical vias. The interposer further includes at least one optical via core comprising a second optical polymer having a higher refractive index than the first optical polymer, the optical via core surrounded by and disposed in contact with the first optical polymer and extending through the glass substrate and substantially perpendicular to the first surface. The interposer includes one or more optical waveguides optically connected to the at least one optical via core, wherein the one or more optical waveguides comprise a deposited layer of a second optical polymer that is at least partially encapsulated by a first optical polymer, wherein the first optical polymer is bonded to at least one of the first surface and the second surface of the glass substrate.

BRIEF DESCRIPTION OF THE DRAWINGS

Various features and advantages of the present invention may be more readily understood with reference to the following detailed description taken in conjunction with the accompanying drawing sheets.

FIG. 2A is a cross-sectional and associated top view illustrating one step in the process of manufacturing one embodiment of an optical interposer according to an example implementation of the disclosed technology.

FIG. 2B is a cross-sectional and associated top view illustrating one step in the process of manufacturing one embodiment of an optical interposer according to an example implementation of the disclosed technology.

FIG. 2C is a cross-sectional and associated top view illustrating one step in the process of manufacturing one embodiment of an optical interposer according to an example implementation of the disclosed technology.

FIG. 2D is a cross-sectional and associated top view illustrating one step in the process of manufacturing one embodiment of an optical interposer according to an example implementation of the disclosed technology.

FIG. 4A depicts a series of cross-sectional views 400-410 illustrating example steps in the process of manufacturing one embodiment of an optical interposer according to an example implementation of the disclosed technology.

DETAILED DESCRIPTION

Figure 1:
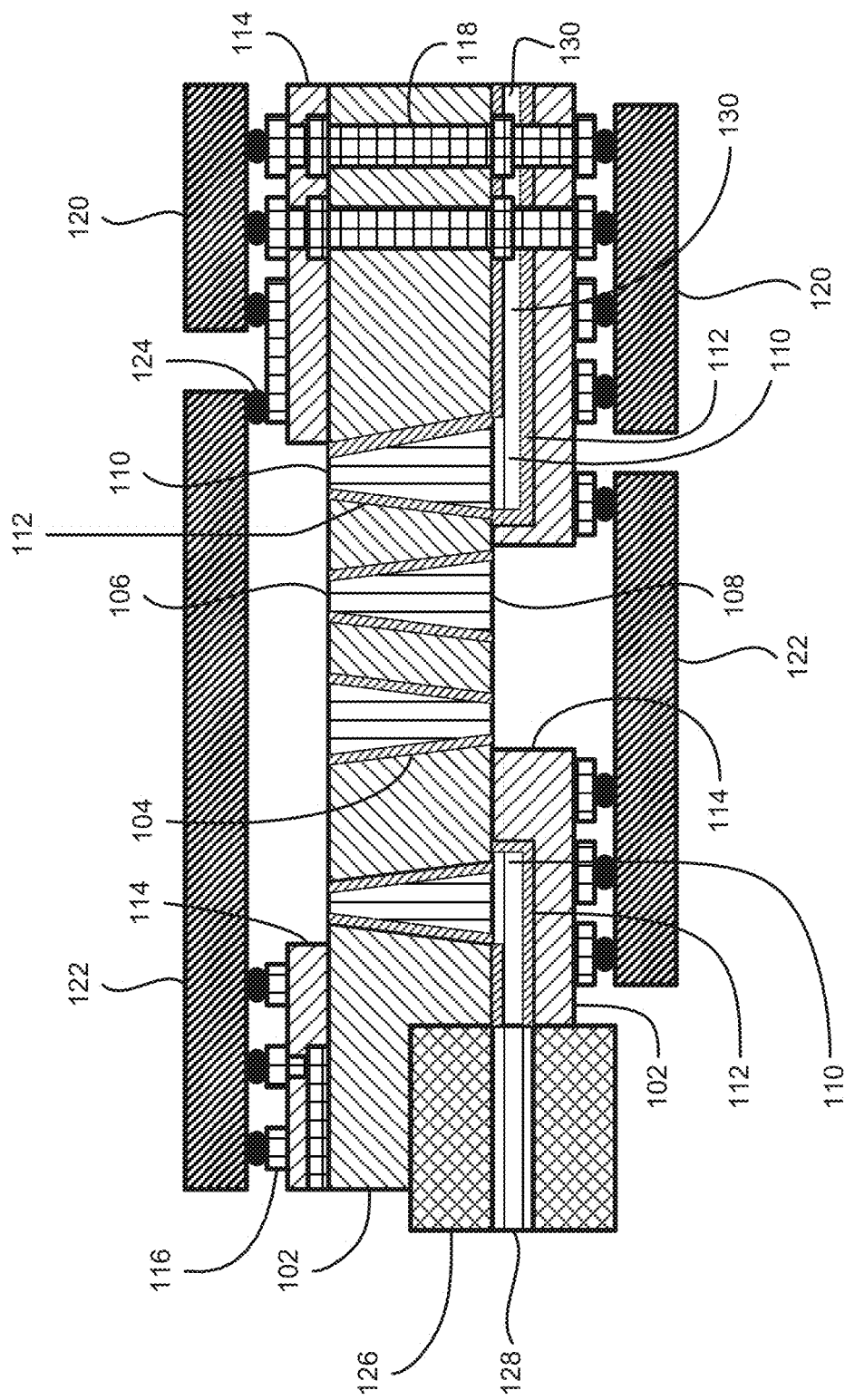
FIG. 1 is a cross-sectional view illustrating one embodiment of an optical interposer according to an example implementation of the disclosed technology.

To facilitate an understanding of the principles and features of the various embodiments of the invention, various illustrative embodiments are explained below. Although exemplary embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the exemplary embodiments, specific terminology will be resorted to for the sake of clarity.

It must also be noted that, as used in the specification and the appended claims, the singular forms "a," "an" and "the" include plural references unless the context clearly dictates otherwise. For example, reference to a component is intended also to include composition of a plurality of components. References to a composition containing "a" constituent is intended to include other constituents in addition to the one named.

Also, in describing the exemplary embodiments, terminology will be resorted to for the sake of clarity. It is intended that each term contemplates its broadest meaning as understood by those skilled in the art and includes all technical equivalents which operate in a similar manner to accomplish a similar purpose.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

Similarly, as used herein, "substantially free" of something, or "substantially pure", and like characterizations, can include both being "at least substantially free" of something, or "at least substantially pure", and being "completely free" of something, or "completely pure".

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

The materials described as making up the various elements of the invention are intended to be illustrative and not restrictive. Many suitable materials that would perform the same or a similar function as the materials described herein are intended to be embraced within the scope of the invention. Such other materials not described herein can include, but are not limited to, for example, materials that are developed after the time of the development of the invention.

The Optical Interposer Apparatus

Optical communications offer extremely high data transmission rates, without many of the physical constraints of electrical signals travelling though copper traces. Embodiments of the disclosed technology enable the exchange of data optically over short distances, such as between side-by-side components on an interposer or on opposite sides of an interposer.

Implementations of the disclosed technology provide fabrication details and unique usage of the low loss polymer optical waveguides, vias, and turning structures on a glass substrate for high I/O density communications. Certain implementations of the disclosed technology utilize a glass substrate of 30~200 μm thickness, with fine-pitch and high density vias and other patterns formed, for example, by Excimer laser ablation. Certain example implementations, utilize chromium-quartz mask using projection lithography to define the regions for ablation.

According to an example implementation of the disclosed technology, a targeted via pitch (i.e., center to center spacing) of as low as 50 μm can be achieved to accommodate single mode operation. In certain example implementations, a wide range of pitches may be achieved. In accordance with an example implementation of the disclosed technology, a via may be formed by ablating the glass substrate, follow by smoothing of via entry point by chemical etching, then the via hole may be conformal coated with polymer lower cladding. In certain example implementations, the laser ablation plus etching may produce high surface smoothness and low scattering loss. In certain example implementations, a naturally tapered shape of the via hole may be taken advantage of to enable a low-loss turning structure in one direction that can also preserve single mode operation.

In certain example implementations, the thickness of the lower cladding may be set so that it does not entirely fill up the cavity, therefore leaving enough space for a photo-definable core material to be spin coated on the interposer. According to an example implementation of the disclosed technology, after patterning and development, the upper cladding may be spin coated on to cover the entire optical layer. In accordance with an example implementation of the disclosed technology, an electrical interface may be built on top of the optical layer.

In certain example implementations, coupling of optical fibers to the vertical and horizontal waveguide structures may be done by etching out trenches or grooves on the polymer layers or the glass substrate itself.

Referring now to the Figures, in which like reference numerals represent like parts, various embodiments of the optical interposer and method of manufacturing the same will be disclosed in detail.

FIG. 1 shows a cross-section of one embodiment of the optical interposer having a glass substrate 102 with one or more optical vias 104. In one example implementation, the glass substrate is preferably between 30-200 μm thick. In one example implementation, the glass is preferably type ENA-1 glass. According to an example implementation, the optical vias 104 may be spaced as closely together as 50 μm, center-to-center. The interior surface of each optical via 104 preferably has a smooth surface to reduce scattering loss.

In accordance with an example implementation of the disclosed technology, each optical via 104 may be tapered such that the via 104 changes in size as it extends through the glass substrate 102 from a first surface 106 to a second surface 108 of the glass substrate 102. In certain example implementations, the interior surfaces of each optical via 104 may be coated with a first optical polymer 112. In an example implementation, the core of each optical via 104 may be made from a second optical polymer 110. The optical vias 104 facilitate transmission of optical signals through the glass substrate 102. For example, in certain implementations, the first optical polymer 112 has a lower index of refraction than the second optical polymer 110, causing the via to direct optical signals by total internal reflection, as will be understood by those knowledgeable in the art.

In certain example implementations, the optical interposer may also include one or more optical waveguides 130. The optical waveguides 130, for example, may serve to channel optical signals in a confined path parallel to a surface 106, 108 of the glass substrate 102. The optical waveguides 130 likewise may include a core composed of the second optical polymer 110. The core may be at least partially encapsulated or surrounded by a clad with optical isolation layers composed of the first optical polymer 112. In certain example implementations, the optical waveguides 130 may terminate at one of the optical vias 104. In certain example implementations, the optical waveguides 130 may terminate at an edge of the substrate 102. According to an example implementation of the disclosed technology, optical waveguides 130 terminating at one of the optical vias 104 may be optically coupled to the via 104, causing the optical signal to "turn" from the waveguide direction to the via direction, or vice versa.

In certain example implementations, the optical interposer may include an electrically insulating dielectric layer 114 deposited on and/or bonded to the glass substrate 102. In one example embodiment, the dielectric layer 114 may be a metal-organic framework. In another example implementation, the dielectric layer 114 may be a metal-organic framework comprising a Zeolitic Imidazolate Framework (ZIF). In certain example implementations, the dielectric layer 114 may also be deposited on and/or bonded to the optical isolation layers of the optical waveguides 130.

In an example implementation, the optical interposer may also include electrical vias 118 and electrical traces 116. The electrical vias 118 may include holes or voids extending through the glass substrate 102 and the dielectric layers 114, where the holes or voids may include conductive material, for example, coating their interior walls. In an example implementation, the electrical traces 116 may include conductive material deposited on the surface of the dielectric layers 114. The electrical traces, for example, can terminate in conductive pads for soldering or they can terminate at the electrical vias 118 to form continuous conductive pathways through the interposer. Additional dielectric layers, electrical vias, and electrical traces can be added in the manner of a printed circuit board, as will be understood by those skilled in the art.

In certain example implementations, the optical interposer may include, may be in communication with, or may be mounted to one or more component chips, such as an integrated circuit. In one example implementation, these component chips may be strictly electrical 120. In another example implementation, these component chips they may opto-electrical 122, combining both electrical and optical inputs and outputs. In certain example implementations, the chips may be strictly optical. In yet other implementations, the chips may include combinations of electrical 120 and opto-electrical 122. According to an example implementation of the disclosed technology, the chips 120 122 may be mounted to the optical interposer by soldering, specifically by pre-formed solder "balls" 124, as will be understood by those skilled in the art. In certain example implementations, the opto-electrical components 122 may be aligned with optical vias 104 to facilitate communication via optical signals.

In an example implementation, the optical interposer may be configured to accept optical fibers 126. Such a configuration may ensure that the core 128 of the optical fiber 126 will align with the end of an optical waveguide 130 or and optical via 104, thus facilitating optical communication through the optical fiber 126, the optical waveguide 130, and/or the optical via 104.

The Optical Interposer Example Manufacturing Process

FIGS. 2A-2D illustrate some of the steps in an embodiment of the disclosed manufacturing process for the optical interposer. Specifically, FIGS. 2A-2D illustrate steps in producing a single optical via 104 in accordance with one embodiment of the disclosure.

In FIG. 2A, an optical via 104 is created by making a hole through a glass substrate 102. The hole preferably has an axis perpendicular to one or more flat surfaces 106, 108 of the glass substrate 102. In one embodiment, the via 104 may be made by using an excimer or exciplex laser to ablate the glass substrate 102. In another embodiment, the via 104 may be treated after it is made to reduce the surface roughness within the hole. In an example implementation, the surface roughness may be reduced by chemical etching. In an example implementation, the via 104 may be made by using an excimer or exciplex laser to ablate the glass substrate 102 and the via 104 may be further chemically etched after creation to reduce the surface roughness within the hole.

FIG. 2B illustrates another example step in the manufacturing process for the optical interposer. For example, a portion of the via 104 and a first surface 108 of the optical interposer may be coated with a first optical polymer 112. The coating may preferably be performed by spin coating, as will be understood by those skilled in the art. In certain example implementations, the spin coating and first optical polymer 112 characteristics may be controlled so as to not entirely fill the via 104, as shown in FIG. 2B.

FIG. 2C illustrates another example step in the manufacturing process for the optical interposer. In this example, the remaining portion of the via 104 (as discussed above) may be filled with the first optical polymer 112. In an example implementation, the remaining portion of the via 104 may preferably be filled by lamination, as will be understood by those skilled in the art.

FIG. 2D illustrates another example step in the manufacturing process for the optical interposer. In this step, excess material 204 may be removed and the input/output surface 202 of the via 104 may be prepared to transmit optical signals.

As shown in FIG. 2D, the interposer may include only a first optical polymer 112. In this example embodiment, the first optical polymer 112 may serve as the core of the one or more optical vias 104. In this embodiment, the first optical polymer 112 may be selected such that, upon curing, it has a refractive index higher than the glass substrate 102, causing the via 104 to transmit an optical signal by total internal reflection, as will be understood by those skilled in the art.

Figure 3:
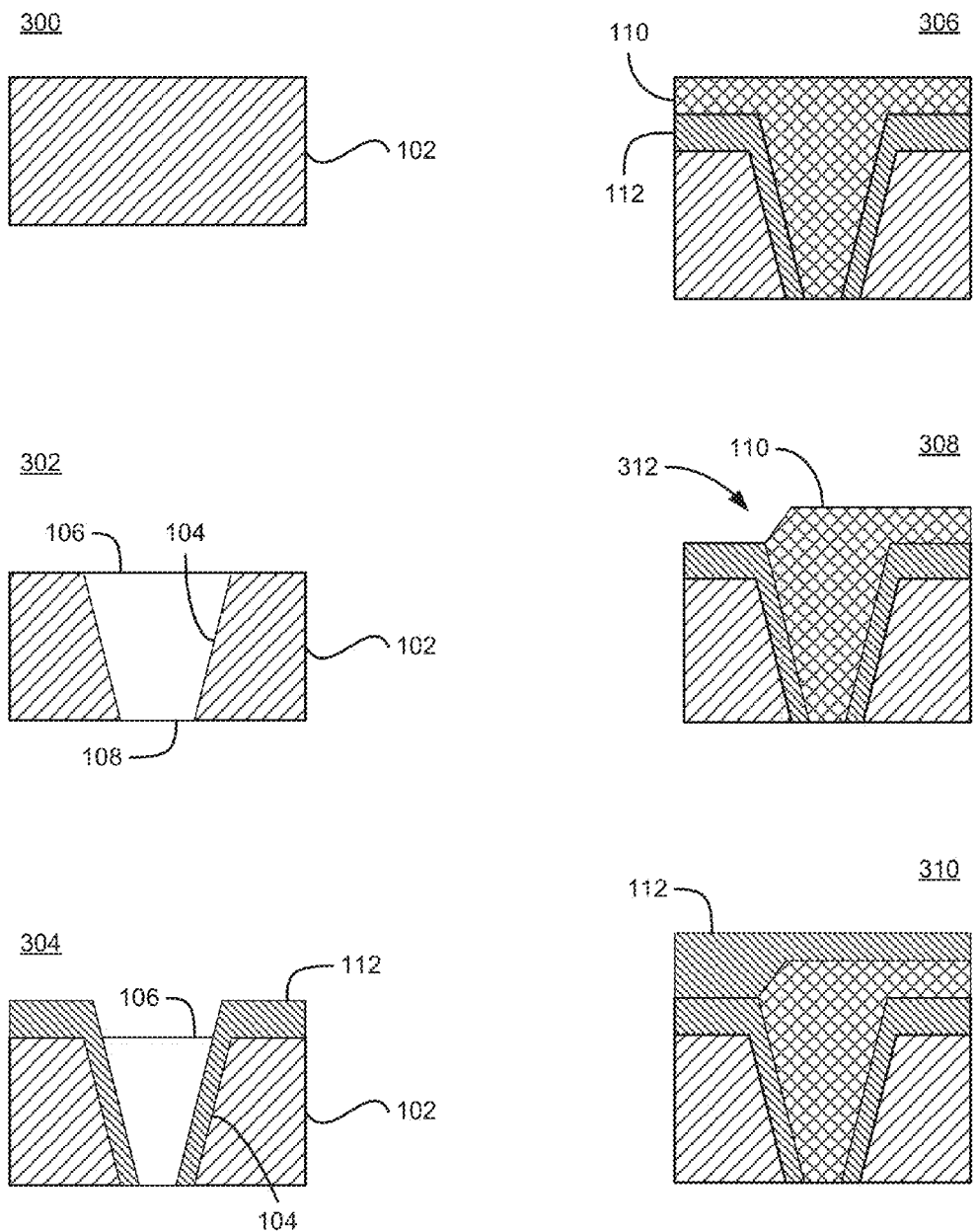
FIG. 3 depicts a series of cross-sectional views 300-310 illustrating example steps in the process of manufacturing one embodiment of an optical interposer according to an example implementation of the disclosed technology.

FIG. 3 illustrates example steps in another embodiment of the disclosed manufacturing process for the optical interposer. Specifically, FIG. 3 illustrates steps in producing a single optical via 104 in accordance with one embodiment of the disclosure. At step 300, a glass substrate 102 is shown. At step 302, an optical via 104 is created by making a hole through a glass substrate 102. The hole preferably has an axis perpendicular to one or more flat surfaces 106, 108 of the glass substrate 102. In one embodiment, the via 104 may be made by using an excimer or exciplex laser to ablate the glass substrate 102. In another embodiment, the via 104 may be treated after it is made to reduce the surface roughness within the hole. In another embodiment, this treatment is preferably done by chemical etching. In a more preferred embodiment, the via 104 is made by using an excimer or exciplex laser to ablate the glass substrate 102 and the via 104 is chemically etched after creation to reduce the surface roughness within the hole.

At step 304, and according to an example implementation, a first optical polymer 112 may be bonded to a first surface 106 of the glass substrate 102 and the interior surfaces of the via 104. The first optical polymer 112 may preferably be bonded by lamination, as will be understood by those skilled in the art.

At step 306, and according to an example implementation, a second optical polymer 110 may be applied over the first optical polymer 112. The application may preferably be performed by spin coating, as will be understood by those skilled in the art, or by any other suitable means.

At step 308, and according to an example implementation, unneeded material of the second optical polymer 110 may be removed 312. For example, in one embodiment, portions of the second optical polymer 110 may be removed 312 by selective curing and etching, as known by those skilled in the art.

At step 310, and according to an example implementation, another layer of the first optical polymer 112 may be bonded to the exposed surfaces of the first optical polymer 112 and the exposed surface of the second optical polymer 110. The first optical polymer 112, for example, may preferably be bonded by lamination, as will be understood by those skilled in the art.

Figure 4B:
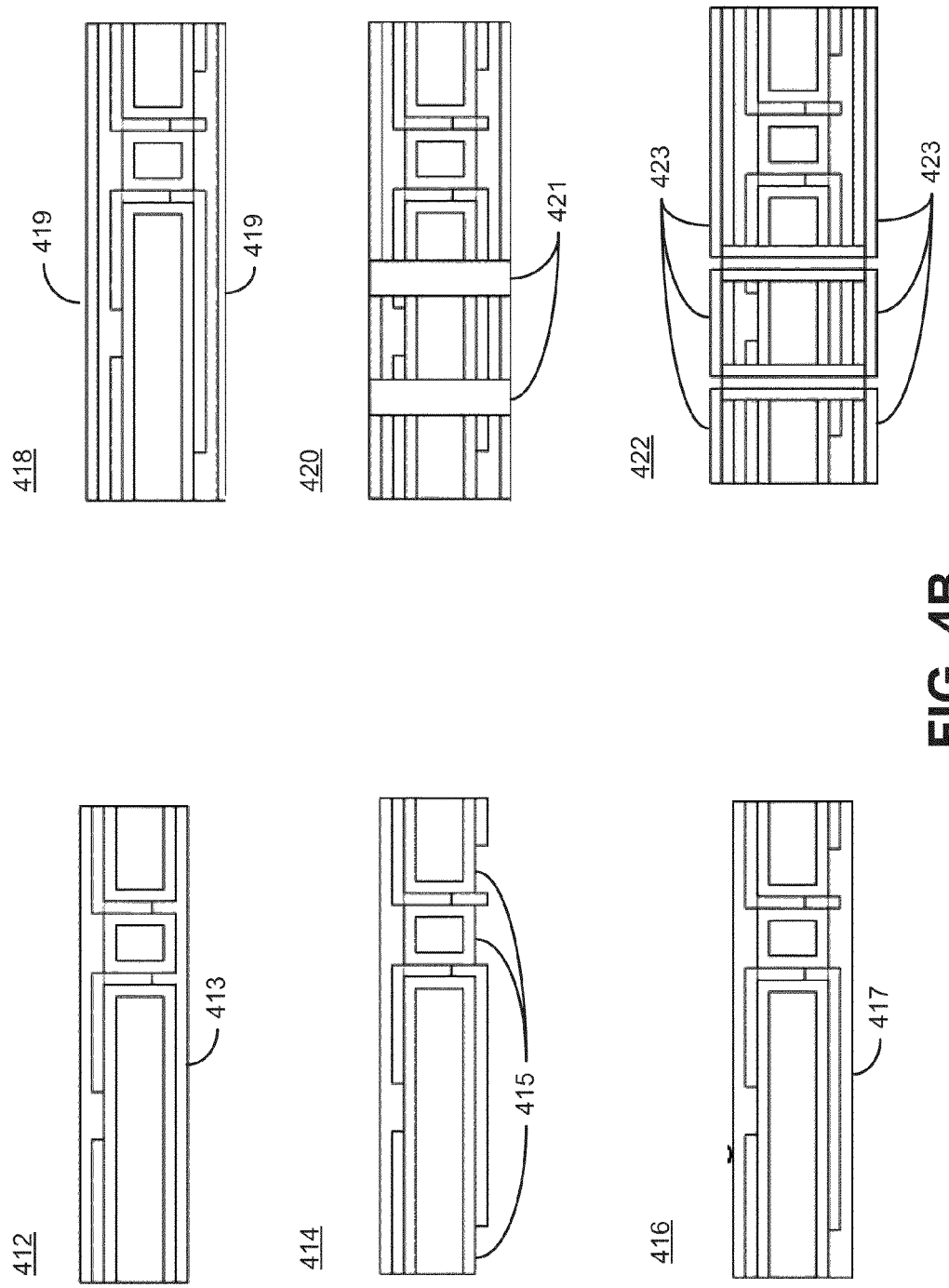
FIG. 4B depicts a series of cross-sectional views 412-422 illustrating example steps in the process of manufacturing one embodiment of an optical interposer according to an example implementation of the disclosed technology.
Figure 4C:
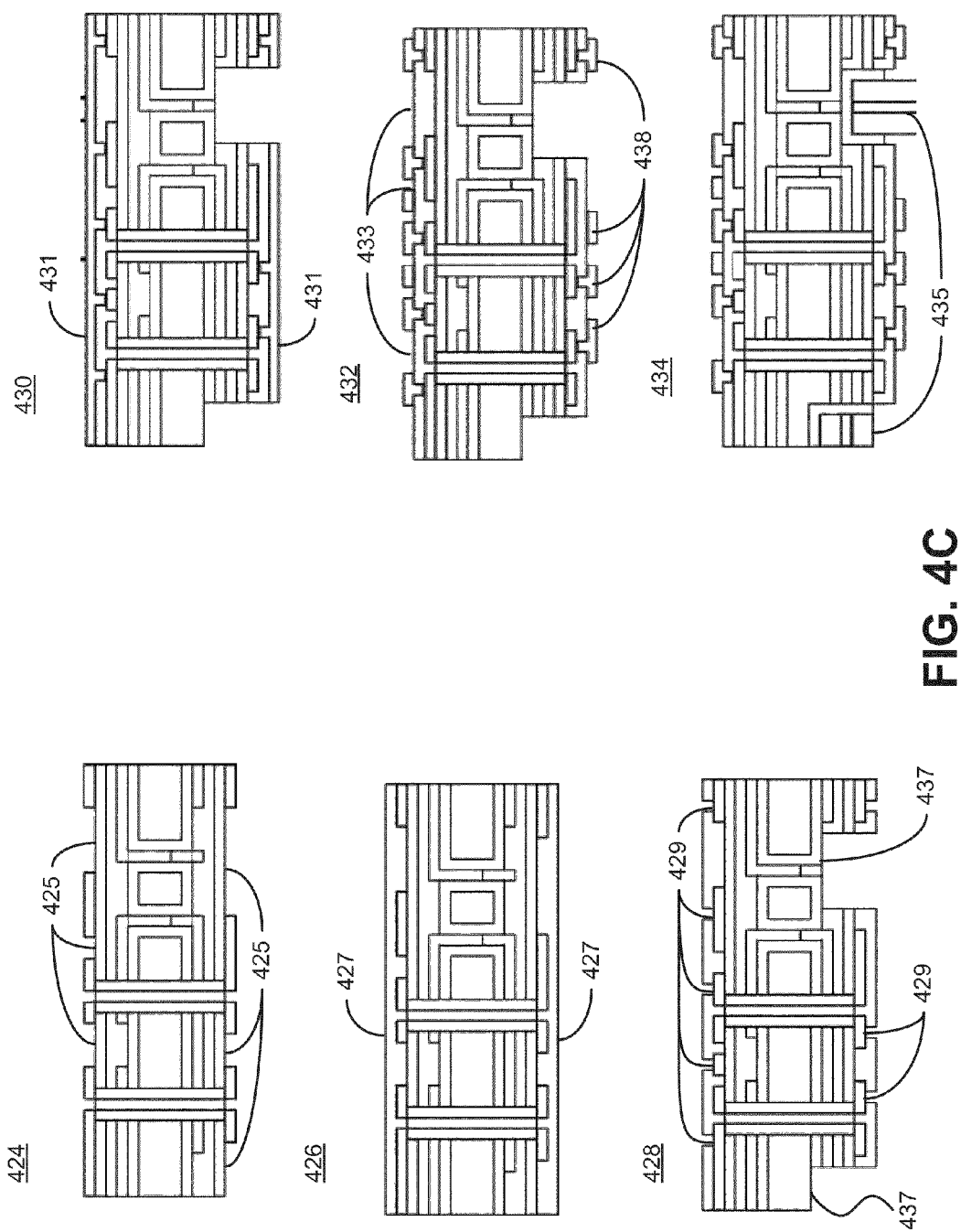
FIG. 4C depicts a series of cross-sectional views 412-422 illustrating example steps in the process of manufacturing one embodiment of an optical interposer according to an example implementation of the disclosed technology.

FIGS. 4A-4C illustrate example steps of an embodiment of the disclosed manufacturing process. At step 400, the process begins with a bare glass substrate 401. At step 402, optical vias 403 are created by laser ablation. At step 404, the glass substrate and the optical vias are laminated with a base optical isolation layer in a first optical polymer, as will be understood by those skilled in the art. At step 406, a top optical core layer 407 of a second optical polymer is applied by spin coating, as will be understood by those skilled in the art. At step 408, unneeded portions 409 of the top core layer are removed. The unneeded portions of the top core may be removed by lithographic techniques, or any suitable technique. At Step 410, an upper optical isolation layer 411 is applied using the same first optical polymer. The upper optical isolation layer may for example be applied by lamination.

FIG. 4B illustrates additional example steps of the manufacturing process illustrated in FIG. 4A. At 412, a bottom optical core layer 413, of the second optical polymer, may be applied by spin coating. At step 414, unneeded portions 415 of the top core layer may be removed. The unneeded portions of the top core may be removed by lithographic techniques, or any suitable technique. At step 416 an upper optical isolation layer 417 may be applied using the same first optical polymer. In certain example implementations, the upper optical isolation layer may for example be applied by lamination. At step 418, a first dielectric layer 419 may be applied to both sides of the optical interposer. In one example implementation, the dielectric layer may be a Zeolitic Imidazolate Framework (ZIF). At step 420 electrical vias 421 may be formed through the existing layers. The electrical vias 421, for example, may be formed by drilling or by laser ablation. At step 422, all or a portion of the exposed surfaces may be coated in conductive material 423. For example, the coating may preferably be performed by electro-plating, as will be understood by those skilled in the art. More preferably, the electro-plated conductive coating may be metallic copper.

FIG. 4C illustrates additional example steps of the manufacturing process illustrated in FIG. 4A and FIG. 4B. At step 424, unneeded portions of the first conductive layer 425 may be removed to facilitate creating a redistribution lay (RDL), as will be understood by those skilled in the art. At step 426, another second ZIF dielectric layer 427 may be applied to both sides of the optical interposer. At step 428, unneeded portions 429 of the second dielectric layer 427 may be removed. Also at step 428, sections of the optical isolation layers and optical core layers may be removed 437 to facilitate future connections to optical fibers. At step 430, exposed surfaces may be coated in conductive material 431, again most preferably by electro-plating them with copper. At step 432, unneeded portions 433 of the second conductive layer may be removed to facilitate creating a second RDL. The remaining conductive material forms solder pads 438. At step 434, optical fibers 435 may be inserted to facilitate optical transmissions.

Figure 5:
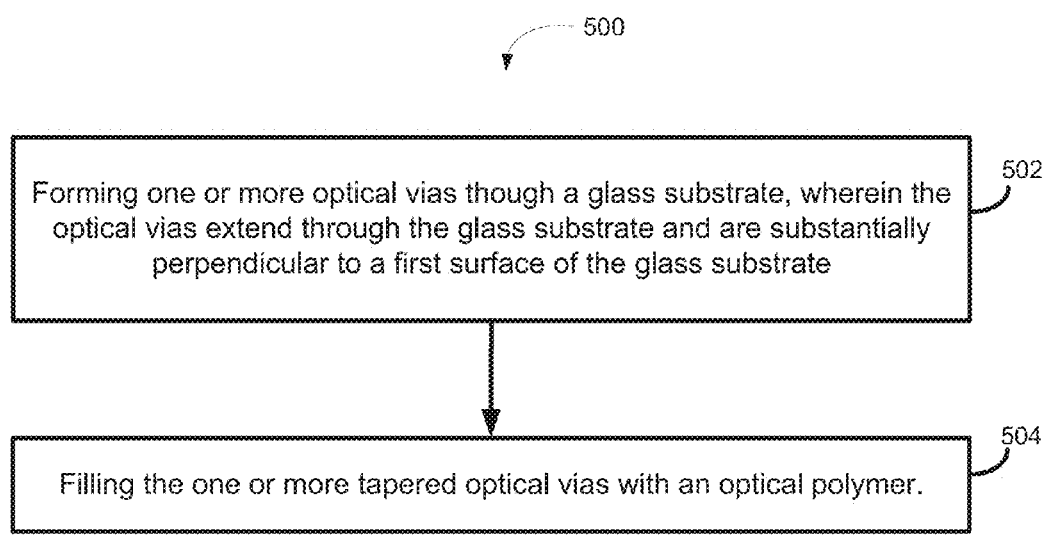
FIG. 5 is a flow diagram of a method 500, according to an example implementation of the disclosed technology.

FIG. 5 is a flow-diagram of a method 500 of manufacturing an interposer. In block 502, the method 500 includes forming one or more optical vias though a glass substrate, wherein the optical vias extend through the glass substrate and are substantially perpendicular to a first surface of the glass substrate. In block 504, the method 500 includes filling the one or more tapered optical vias with an optical polymer.

Certain example implementations may include forming the one or more optical vias by laser ablation. In certain example implementations, the method can further include chemically etching an interior glass surface of the one or more optical vias. In certain example implementations, the method can include depositing one or more optical waveguides on one or more of the first surface or a second surface of the glass substrate, wherein at least one of the one or more optical waveguides is optically coupled to at least one of the one or more optical vias.

Figure 6:
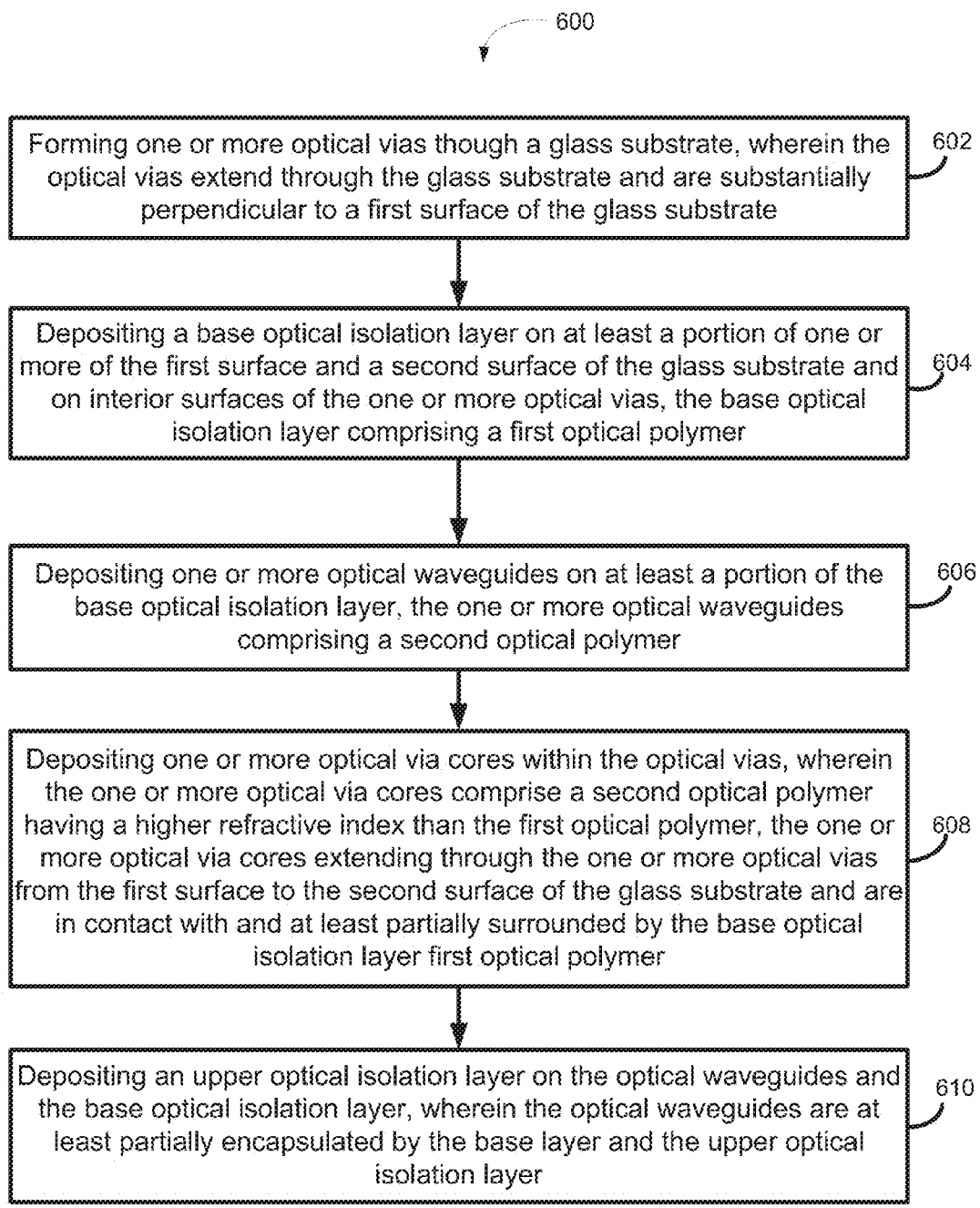
FIG. 6 is a flow diagram of a method 600, according to an example implementation of the disclosed technology.

FIG. 6 is a flow-diagram of another method 600 of manufacturing an interposer. In block 602, the method 600 includes forming one or more optical vias though a glass substrate, wherein the optical vias extend through the glass substrate and are substantially perpendicular to a first surface of the glass substrate. In block 604, the method 600 includes depositing a base optical isolation layer on at least a portion of one or more of the first surface and a second surface of the glass substrate and on interior surfaces of the one or more optical vias, the base optical isolation layer comprising a first optical polymer. In block 606, the method 600 includes depositing one or more optical waveguides on at least a portion of the base optical isolation layer, the one or more optical waveguides comprising a second optical polymer. In block 608, the method 600 includes depositing one or more optical via cores within the optical vias, wherein the one or more optical via cores comprise a second optical polymer having a higher refractive index than the first optical polymer, the one or more optical via cores extending through the one or more optical vias from the first surface to the second surface of the glass substrate and are in contact with and at least partially surrounded by the base optical isolation layer first optical polymer. In block 610, the method 600 includes depositing an upper optical isolation layer on the optical waveguides and the base optical isolation layer, wherein the optical waveguides are at least partially encapsulated by the base layer and the upper optical isolation layer.

Certain example implementations may further include chemically etching at least a portion of interior glass surfaces associated with the one or more tapered optical vias. An example implementation may include laminating one or more sides of the optical interposer with a dielectric metal organic framework. An example implementation may include forming electrical vias through the glass substrate, wherein the electrical vias comprise conductively clad holes through the dielectric laminate, through the base optical layer, through the upper optical isolation layers, and through the glass substrate. An example implementation may include forming electrical traces, wherein the electrical traces comprise conductive material on the surface of the dielectric laminate and are electrically connected to one or more of the electrical vias.

According to an example implementation of the disclosed technology, forming electrical traces includes electroplating the interposer with a conductive metal and removing unwanted conductive metal, leaving conductive metal in a pattern of electrical traces.

In certain example implementations, depositing the one or more optical waveguides includes depositing the second optical polymer on a first side of the interposer and partially through the optical vias by spin coating, removing unwanted material of the second optical polymer from the first side, depositing the second optical polymer on a second side of the interposer and the remainder of the way through the optical vias by spin coating; and removing unwanted material of the second optical polymer from the second side. In an example implementation, unwanted material of second optical polymer may be removed by lithographic methods.

In certain example implementations, the holes for the one or more optical vias are created by ablating the glass substrate with a laser. In certain example implementations, the laser has a gain medium including at least one noble gas.

Implementations of the disclosed technology may provide certain technical effects, such as creating low-cost and robust optical interconnects.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An interposer comprising:
   a glass substrate having a first surface and a second surface, the second surface substantially parallel with the first surface, the glass substrate comprising:
      one or more optical vias extending through the glass substrate and substantially perpendicular to the first surface, the one or more optical vias comprising an optical isolation layer comprising a first optical polymer bonded to an interior glass surface of the one or more optical vias and an optical via core comprising a second optical polymer having a higher refractive index than the first optical polymer, the optical via core surrounded by and disposed in contact with the optical isolation layer and extending through the glass substrate and substantially perpendicular to the first surface;
   one or more base optical isolation layers comprising the first optical polymer deposited on at least a portion of one or more of the first surface and second surface of the glass substrate;
   one or more optical waveguides comprising the second optical polymer and deposited on at least a portion of the one or more base optical isolation layers, wherein the one or more optical waveguides are optically connected to at least one of the one or more optical via cores; and
   one or more upper optical isolation layers comprising the first optical polymer deposited over the one or more optical waveguides and the base optical isolation layer such that the optical waveguides are at least partially encapsulated by the first optical polymer.

2. The interposer of claim 1, wherein the optical vias are at least partially formed by laser ablation.

3. The interposer of claim 1 further comprising one or more optical waveguides connected to at least one of the one or more optical vias, wherein the one or more optical waveguides comprise a deposited layer of the second optical polymer that is in contact with at least one of the first surface and the second surface of the glass substrate, and the one or more optical waveguides are optically connected to the at least one of the one or more optical vias.

4. The interposer of claim 1 further comprising:
   one or more dielectric layers deposited on one or more of the one or more upper optical isolation layers;
   conductive traces deposited on the dielectric layers; and
   electrical vias comprising holes protruding through the glass substrate, through the base optical isolation layer, through the upper optical isolation layer, and through the dielectric layers from the first surface to the second surface of the glass substrate, wherein interior surfaces of the electrical vias are coated with conductive material and the electrical vias form continuous electrical connections between conductive traces on opposing sides of the interposer.

5. The interposer of claim 4 further comprising an electrical insulating layer deposited over the conductive traces and the upper optical isolation layer, wherein the electrical insulating layer is selectively removed to provide electrical and optical access to the conductive traces, the electrical vias, the optical vias, and the optical waveguides.

6. The interposer of claim 1, wherein the one or more optical vias form a tapered hole through the glass substrate, the tapered hole defining a first aperture at the glass substrate first surface having a first cross-sectional area and a second aperture at the glass substrate second surface defining a second cross-sectional area, wherein the first cross-sectional area differs from the second cross-sectional area.

7. The interposer of claim 6, wherein at least a portion of an inner surface of the one or more optical vias has a surface roughness which is characteristic of chemical etching.

8. The interposer of claim 1, wherein the optical isolation layer comprising the first optical polymer has a substantially uniform wall thickness.

9. The interposer of claim 1, further comprising one or more integrated circuits in communication with one or more of the glass substrate and the one or more optical vias of the interposer.

* * * * *